United States Patent [19] — Hisada
[11] Patent Number: 5,059,988
[45] Date of Patent: Oct. 22, 1991

[54] IMAGE FORMING APPARATUS

[75] Inventor: Hidenori Hisada, Tokoname, Japan

[73] Assignee: Brother Kogyo Kabushiki Kaisha, Japan

[21] Appl. No.: 547,139

[22] Filed: Jul. 3, 1990

[30] Foreign Application Priority Data

Aug. 9, 1989 [JP]  Japan ................. 1-93814[U]

[51] Int. Cl.$^5$ ............ G01D 15/24; B65H 29/70; B65H 31/00
[52] U.S. Cl. ................. 346/134; 271/188; 271/209
[58] Field of Search ............ 346/134, 107 R; 219/216; 162/270, 271; 493/460, 461; 271/188, 209

[56] References Cited

U.S. PATENT DOCUMENTS

| 4,300,891 | 11/1981 | Bemiss | 162/271 |
| 4,475,896 | 10/1984 | Bains | 162/271 |
| 4,745,416 | 5/1988 | Horihata | 346/108 |
| 4,884,082 | 11/1989 | Sonoda et al. | 346/107 R |
| 4,900,173 | 2/1990 | Okamura | 346/134 |

FOREIGN PATENT DOCUMENTS

| 0000550 | 1/1980 | Japan | 355/317 |
| 2212481 | 7/1989 | United Kingdom | 271/209 |

Primary Examiner—Benjamin R. Fuller
Assistant Examiner—David Yockey
Attorney, Agent, or Firm—Oliff & Berridge

[57] ABSTRACT

In an image forming apparatus, a mask original prepared by a monochrome laser printer and a photosensitive recording medium are brought into close contact with each other and in this state are subjected to exposure in an exposure unit. Thereafter, the photosensitive recording medium and a developer sheet are subjected to pressure-development and heat-fixing, and a color image is outputted onto the developer sheet. The image forming apparatus is provided with a recurler for remedying curl formed at the front edge of a mask original. Thus, the curl is remedied by the recurler, so the mask original can be positioned accurately in a positioning device.

9 Claims, 3 Drawing Sheets curl amount

IMAGE FORMING APPARATUS

BACKGROUND OF THE INVENTION

1. Field of the Invention

The present invention relates to an image forming apparatus which outputs a color image using a mask original formed by a monochrome laser printer. Particularly, the present invention is characterized by being provided with a recurler for remedying a curl of the front edge of the mask original in a suitable position, e.g., halfway of a mask original conveying path.

2. Description of the Related Art

According to the related art, a mask original formed by a monochrome laser printer is conveyed to a positioning device by means of a mask original conveying device. By virtue of electrostatic attraction, the mask original is attracted to a belt of a light-transmitting dielectric material mounted in the positioning device and is set to a predetermined position. Thereafter, a photosensitive recording medium is brought into close contact with the mask original, followed by exposure using an exposure unit. In this way, exposure is conducted three times using mask originals corresponding to R (red), G (green) and B (blue), respectively. Then, a developer sheet and the photosensitive recording medium are subjected to pressure development, whereby a latent image formed on the photosensitive recording medium is rendered visible on the developer sheet. Next, heat fixing is performed and a color image is outputted.

However, the mask original provided from the laser printer becomes curled at the front end thereof, so it is not satisfactorily attracted to the belt in the positioning device, thus sometimes resulting in inaccurate positioning of the mask original.

SUMMARY OF THE INVENTION

The present invention has been accomplished for overcoming the above-mentioned problem and it is an object of the invention to provide an image forming apparatus having a recurler for remedying a curl of a mask original which is outputted from a laser printer or the like.

In order to achieve the aforementioned object, in one aspect of the present invention, a photosensitive recording medium and an original are brought into close contact with each other, then the photosensitive recording medium and a developer sheet are pressurized together to form an image on the developer sheet, and there is provided a recurler for remedying a curl of the front edge of the original in a suitable position along an original conveying path.

According to the image forming apparatus of the present invention having the above construction, since curl of the front end of a mask original is remedied by the recurler, the sticking of the original onto a belt in a positioning device is improved.

The above and further objects and novel features of the invention will become more apparent from the following detailed description when the same is read in connection with the accompanying drawings. It is to be understood, however, that the drawings are for purpose of illustration only and are not intended as a definition of the limits of the invention.

DETAILED DESCRIPTION OF THE PREFERRED EMBODIMENTS

Embodiments of the present invention will be described hereinunder with reference to the accompanying drawings.

Figure 1:
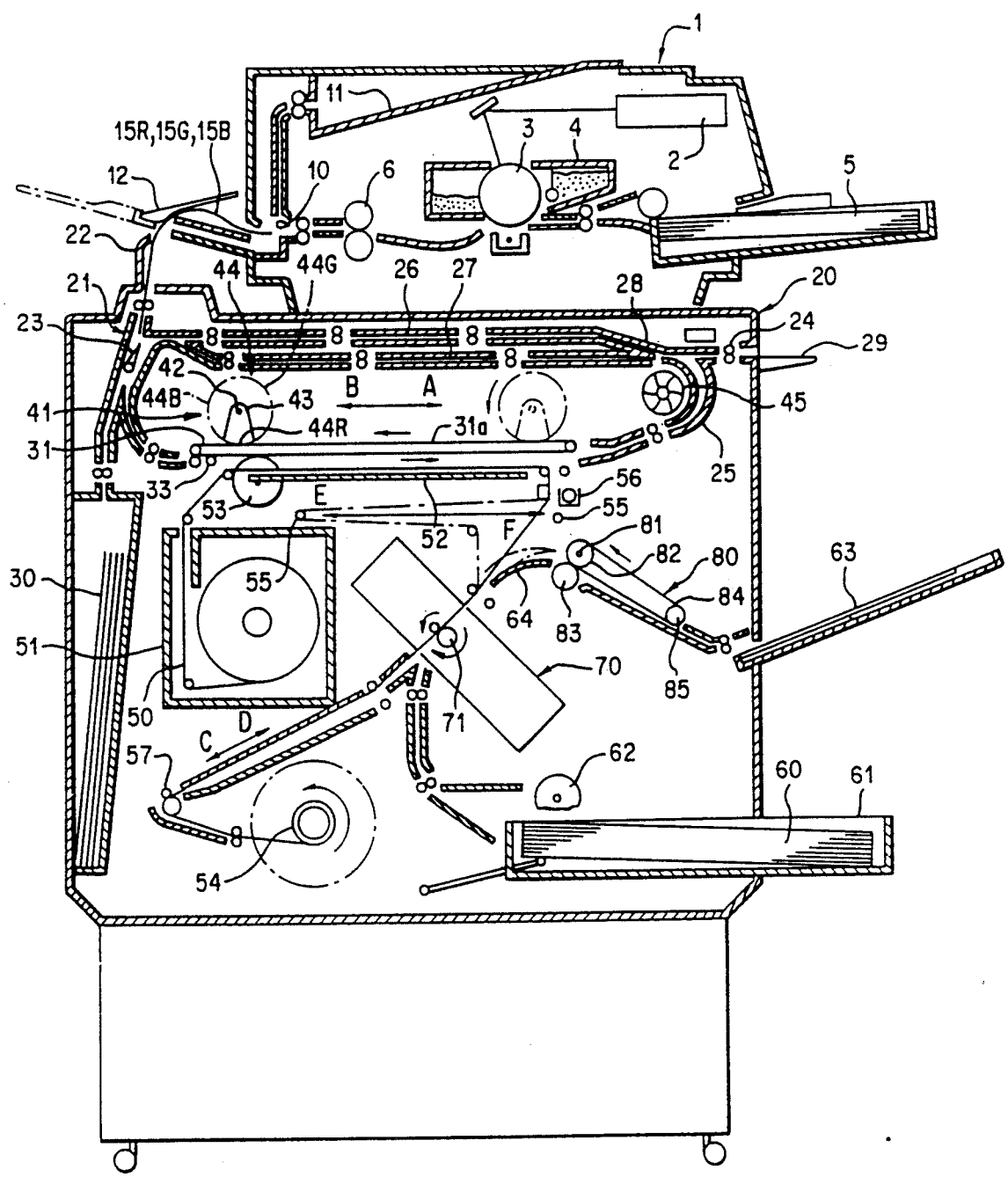
FIG. 1 is a sectional front view of an image recording apparatus embodying the present invention.

FIG. 1 is a sectional view of a monochrome laser printer 1 and a color image recording apparatus 20 both coupled together.

The monochrome laser printer 1 is mounted on the upper portion of the color image recording apparatus 20. A polygon scanner 2 disposed within the laser printer 1 radiates laser light onto a charged photosensitive body 3 to draw an electrostatic latent image. The photosensitive body 3 with the electrostatic latent image formed thereon is developed by a developing unit 4, and a toner image is transferred onto ordinary paper sheet or an overhead projector (OHP) sheet fed from a feed cassette 5 and is fixed by a fixing unit 6. Usually, the monochrome laser printer 1 records data transmitted from a host computer.

The output sheet of the laser printer 1 is transmitted in a paper path changeover portion 10 to a monochrome discharge tray 11 or a discharge tray 12 in the case where a black-and-white image is required, or toward the discharge tray 12 when a color image is required, and is then introduced into the color image recording apparatus 20.

The front end side of the discharge tray 12 is pivotable between its position indicated by a solid line in FIG. 1 and its position indicated by a chain line therein. When it is in the solid line position, sheet provided from the laser printer 1 is introduced into the color image recording apparatus 20. Three sheets monochromatically printed and provided from the laser printer 1 constitute one set and are utilized as mask originals 15 (15R, 15G, 15B) in the color image recording apparatus 20.

The construction of the color image recording apparatus 20 will be described below.

Figure 2:
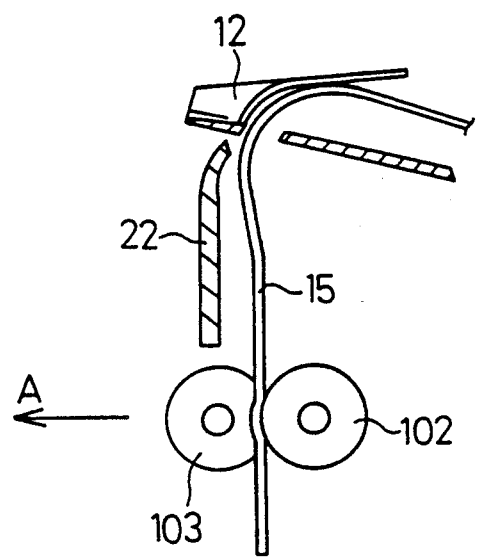
FIG. 2 is a sectional view of a recurler according to a first embodiment of the present invention.

In the upper portion of the body of the color image recording apparatus 20, there is disposed a mask original conveying system 21 which comprises a positioning device 31, a circulation guide 25 and two parallel receptacle portions 26 and 27. These components of the mask original conveying system 21 are connected together annularly. The positioning device 31 and the receptacle portions 26 and 27 of the mask original conveying system 21 are connected to the discharge tray 12 of the monochrome laser printer 1 through a guide member 22 and a recurler 101. As shown in FIG. 2, the recurler 101 is composed of a foamed polymer soft sponge roll 103 and a hard roll 102, to remedy curl in the direction of A. A sheet (a mask original) provided from the monochrome laser printer 1 is introduced into the mask original conveying system 21. A gate 23 is disposed in the mask original conveying system 21 under the guide member 22, and by means of the gate 23 the mask original 15 which has been conveyed while guided by the guide member 22 is directed to either the positioning device 31 side or a discharge tray 30. Further, between the circulation guide 25 and the two receptacle portions 26 and 27 there is disposed a gate 28, and by means of the gate 28 the mask original 15 which has been conveyed while guided by the circulation guide 25 is directed to either the upper receptacle portion 26 side or the lower receptacle portion 27 side. On the other hand, a mask original 15 inserted from a hand tray 29 is introduced into the mask original conveying system 21 through a gate 24.

The positioning device 31 is constituted by an endless belt 31a formed of a light transmitting dielectric material (e.g. polyethylene terephthalate: PET) and stretched between two rotary shafts. At least one of the two shafts is rotated by a motor (not shown), whereby the belt 31a is driven circulatively in an arrowed direction in FIG. 1. The surface of the belt 31a is charged by a charger (e.g. corotron, not shown) to attract the mask original 15 electrostatically. In the vicinity of the belt 31a is disposed a sensor 33 for positioning, which reads a position mark printed in a predetermined position of the mask original 15 to set the mask original in a predetermined position.

Above the positioning device 31 is disposed an exposure unit 41, which can move rightward and leftward along the positioning device 31. The exposure unit 41 is composed of a linear white light source (hereinafter referred to simply as a "lamp") 42, a reflecting plate 43 which reflects light from the lamp 42, and a color separation filter 44 disposed so as to surround the lamp 42 and the reflecting plate 43, the color separation filter 44 comprising a red filter 44R, a green filter 44G and a blue filter 44B. At an upper right portion in the apparatus 20 is arranged a cooling fan 45 for cooling down the lamp 42 in the exposure unit 41.

A photosensitive recording medium 50 is formed mainly by a photocurable resin using a polymerization initiator which is known in Japanese Patent Laid-Open No. 143044/1987. It is produced by applying onto a base sheet numerous microcapsules, each containing a photocurable resin which cures upon exposure to light rays of red, green and blue wavelengths and dye precursors of cyan, magenta and yellow. The photosensitive recording medium 50 is contained in a cartridge 51 so as not to be exposed to light. The photosensitive recording medium 50 once drawn out from the cartridge 51 passes between the belt 31a and an exposure table 52 and is wound round a take-up roller 54 through a fixing roller 56, a looseness removing device 55, a movable guide 64, a pressure-developing unit 70 and further through a driving roller 57. At the time of exposure by the exposure unit 41, the exposure table 52 is raised by a cam 53, whereby the mask original 15 which has been conveyed by the belt 31a and the photosensitive recording medium 50 are brought into close contact with each other. During development processing in the pressure-developing unit 70, the fixing roller 56 presses and fixes the photosensitive recording medium 50 which has gone through the exposure step. The looseness removing device 55 prevents the photosensitive recording medium 50 from becoming loose during development processing in the pressure-developing unit 70. Further, the driving roller 57 can feed the photosensitive recording medium 50 at a constant speed.

A developer sheet 60 is obtained by applying onto a base paper, for example, the developer shown in Japanese Patent Laid-Open No. 88739/1983, and it is set in a cassette 61 so that a surface with the developer applied thereon faces down. The developer sheet 60 is taken out one at a time from the cassette 61 and fed to the pressure-developing unit 70 by means of a feed roller 62 which is driven intermittently by a drive source (not shown). The developer sheet 60, in an overlapped state with the photosensitive recording medium 50 already exposed, is pressurized by a pair of pressure rollers 71 of the pressure-developing unit 70, whereby a latent image which has been formed on the photosensitive recording medium 50 by exposure is rendered visible on the developer sheet 60.

A heat fixing unit 80 is composed of a heated roller 82 containing a heater 81, an auxiliary roller 85, an endless belt 84 stretched between the heated roller 82 and the auxiliary roller 85, and a presser roller 83 which is held in pressure contact with the heated roller 82 through the endless belt 84. The developer sheet 60 which has been guided and conveyed from the pressure-developing unit 70 by means of the movable guide 64 is subjected to glazing in the heat fixing unit 80 and thereafter discharged onto a discharge tray 63.

The operation of the image forming apparatus constructed as above will be described below.

First, the mask original 15R for red color is prepared by the monochrome laser printer 1. The mask original 15R carries toner as a light shielding image thereon to cover the microcapsules applied onto the photosensitive recording medium 50 except the microcapsules containing a dye precursor of cyan color in order to cure the latter microcapsules.

At this time, the discharge tray 12 of the monochrome laser printer 1 is in its solid line position, so the mask original 15R is guided to the recurler 101 by the guide member 22 and curl in the direction of A of the mask original 15R is remedied. Thereafter, the mask original 15R is guided into the mask original conveying system 21 of the color image recording apparatus 20.

At this time, when it is detected by the sensor 33 of the positioning device 31 that there is no other mask original 15 in the positioning device 31, the mask original 15R is conveyed to the positioning device 31 by the gate 23.

Next, the mask original 15R is attracted to the belt 31a by virtue of an electrostatic attraction and thereby conveyed up to a predetermined exposure position. Then the sensor 33 of the positioning device 31 reads the position mark printed on the mask original 15R and the mask original is brought into an exact position by means of a drive source (not shown).

Then, the fixing roller 56 presses the photosensitive recording medium 50 and the cam 53 rotates only by a predetermined angle under the operation of a drive source (not shown) to push up the exposure table 52, whereby the photosensitive recording medium 50 comes into close contact with the belt 31a of the positioning device 31 while holding the mask original 15R therein.

When the exposure table 52 comes into close contact with the positioning device 31, the lamp 42 turns ON and the photosensitive recording medium 50 is exposed to red light through the red filter 44R and also through the mask original 15R, so that the exposure unit 41 performs scanning exposure in the direction of an arrow A. When the exposure is over, the lamp 42 turns OFF and the exposure unit 41 moves back in the direction of an arrow B. At this time, the filter cylinder 44 of the exposure unit 41 rotates under the operation of the drive source (not shown) and the green filter 44G is positioned just under the lamp 42.

On the mask original 15 there is also printed a color mark indicating the color of the mask original in addition to the position mark, and this color mark is read by a sensor simultaneously with the positioning operation. The filter cylinder 44 is provided with a sensor for detecting the origin of each of the three kinds of filters 44R, 44G and 44B, and when the read color mark is not in correspondence to the filter in the exposure unit 41 the filter cylinder 44 rotates until correspondence to a predetermined filter is obtained. While the exposure unit 41 moves back, the exposure table 52 goes down with rotation of the cam 53, and the photosensitive recording medium 50 moves away from the positioning device 31 and the mask original 15R.

At this time, back tension is applied to the photosensitive recording medium 50 at the rotational center of the roll of the photosensitive medium 50 in the cartridge 51, so that when the exposure table 52 rises, the photosensitive recording medium 50 is drawn out from the cartridge 51 by a length thereof corresponding to the amount of ascent of the exposure table 52. On the other hand, upon completion of the exposure and descent of the exposure table 52, the photosensitive recording medium 50 is wound back in the direction of removing the looseness thereof.

When the exposure using the mask original 15R for red color is over and the descent of the exposure table 52 is detected, the belt 31a of the positioning device 31 rotates and the mask original 15R passes the circulation guide 25, then is guided into the receptable portion 26 by the gate 28.

Next, the mask original 15G for green color prepared by the monochrome laser printer 1 passes the guide member 22 and the recurler 101, then is guided to the positioning device 31 by the gate 23.

After positioning is performed for the photosensitive recording medium 50 in the same manner as in the case of the mask original 15R, the exposure table 52 rises and the photosensitive recording medium 50 and the mask original 15G come into close contact with the belt 31a of the positioning device 31. Thereafter, the lamp 42 turns ON and exposure using green light is performed through the green filter 44G. When the exposure is over, the exposure table 52 goes down and the mask original 15G passes the circulation guide 25 and is guided upwards, while the gate 28 rotates and the mask original 15G is guided to the receptacle portion 27. The exposure unit 41 returns to its home position and the filter cylinder 44 rotates until the blue filter 44B is positioned just under the lamp.

Then, in the same way as above the mask original 15B for blue color prepared by the monochrome laser printer is conveyed by the original conveying system 21 and is brought into a predetermined position by the positioning device 31. Thereafter, the photosensitive recording medium 50 is exposed to blue light by means of the exposure unit 41.

By the above operations a latent image of a desired color image has been recorded on the photosensitive recording medium 50.

Next, the exposure table 52 goes down and the fixing roller 56 moves away from the photosensitive recording medium, and the driving roller 57 rotates to wind up the photosensitive recording medium 50 in the direction of an arrow C. At this time, the buffer 55 for removing the looseness of the photosensitive recording medium 50 and the movable guide member 64 are in the respective solid line positions and the pressure rollers 71 of the pressure-developing unit 70 are spaced from each other. Therefore, during the take-up operation, the microcapsules of the photosensitive recording medium 50 are prevented from being damaged or broken. The driving roller 57 stops when the rear end portion of the latent image on the photosensitive recording medium 50 arrives at the pressure rollers 71 of the pressure-developing unit 70.

In synchronism with the movement of the photosensitive recording medium 50, the developer sheet 60 is delivered from the cassette 61 by means of the feed roller 62 and stops in a position in which the front end of the developer sheet is located at the rear end of the photosensitive recording medium 50.

Next, by means of a driving device (not shown) the pressure rollers 71 of the pressure-developing unit 70 are brought into pressure contact with the recording medium and the developer sheet while rotating in the arrowed directions, while the fixing roller 56 again presses and fixes the photosensitive recording medium 50, whereby the recording medium 50 is fed in the direction of an arrow D in an overlapped state with the developer sheet 60 while being pressurized. The uncured microcapsules on the photosensitive recording medium 50 are broken by pressure and a color image corresponding to the latent image on the recording medium 50 is developed on the developer sheet 50.

As the pressure rollers 71 of the pressure-developing unit 70 rotate in the arrowed directions, the looseness removing device 55 moves in the direction of an arrow E to absorb the looseness of the photosensitive recording medium 50. When the looseness removing device 55 moves in the direction of the arrow E, the movable guide 64 is moved to the position indicated by a chain line by means of a mechanism (not shown) to peel off the front end of the developer sheet 60 from the photosensitive recording medium 50 and guides it toward the heat fixing unit 80.

In the heat fixing unit 80, the developer sheet 60 receives heat energy from the heater 81 through the heated roller 82 which is rotating and the endless belt 84, whereby the color development of the color image is promoted. At the same time, a binder polymer (a binding resin) for fixing the developing medium to the base of the developer sheet 60 is heat-melted to afford smoothness corresponding to the surface smoothness of the endless belt, whereby the surface of the developer sheet 60 is given moderate gloss.

The developer sheet 60 which has gone through the color development and glazing treatment is separated with curvature from the endless belt 84 and is discharged onto the discharge tray 63.

Since the photosensitive recording medium 50 is pressed and fixed by the fixing roller 56 during a series of development and color developing and glazing treatment described above, it is not influenced in the steps preceding the exposure table 52 by changes in tension of the recording medium 50 caused by the subsequent development step. Therefore, during development processing for one image, it is possible to perform an exposure processing for a latent image of another color image.

Where plural color images are to be obtained from the same mask original 15, the mask original 15R standing by in the receptacle portion 26 is again guided to the positioning device 31 through the gate 23 in the mask original conveying system 21 and the same processing as in the exposure processing for the first original is performed. Also as to the mask originals 15G and 15B, both are successively guided to the positioning device 31 upon completion of exposure of the preceding mask original 15R, utilizing the receptacle portions 26 and 27. Thus, the mask original conveying system 21 can cause the mask original 15 to circulate a required number of times repeatedly.

After a required number of color images are obtained from the same mask original 15, the gate 23 rotates and guides each mask original 15 in the mask original conveying system 21 to the discharge tray 30.

In the event the next combination of mask originals 15 should enter the color image recording apparatus from the monochrome laser printer 1 during exposure processing of a series of color images, the gate 23 guides these mask originals to the discharge tray 30.

Further, the mask original conveying system 21 is provided with the hand tray 29 for manually taking in each mask original 15 which has been prepared by another means as noted previously. Provided, however, that in the case where another mask original is already provided in the mask original conveying system 21, there is provided the gate 24 to prevent hand operation.

The present invention is not limited to the embodiment described in detail above. Various modifications may be made without departing from the scope of the invention.

Figure 3:
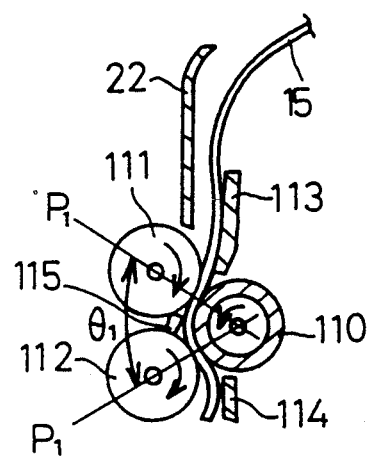
FIG. 3 is a sectional view of a recurler according to a second embodiment of the present invention.
Figure 5:
FIG. 5 is a view explanatory of the amount of curl of a mask original.

For example, such a recurler as shown in FIG. 3 is employable. This is composed of a rubber roller 110 having a hardness of 70°–90° (as specified in JIS K 6301 and ASTM D 430, 813, 1052, 623) and a diameter of 10 mm, metallic free-running rollers 111 and 112 which are rotated by the rotation of the rubber roller 110 and which have a diameter of 10 mm, and guide members 113, 114 and 115. It is optimal that a central angle $\theta_1$ of the rubber roller 110 and the free-running rollers 111 and 112 be in the range of 70° to 120° and that a force $P_1$ of the free-running rollers 111 and 112 with respect to the rubber roller 110 be in the range of 300 to 1,000 g. A mask original 15 formed of an ordinary paper of 55 kg (weight per 1000 sheets, each measuring 1091×788 mm) having an amount of curl of 15 to 20 mm (measured as shown in FIG. 5) passes between the rubber roller 110 and the free-running roller 111, guide member 115, and free-running roller 112 while being guided by the guide members 22 and 113. As a result, the amount of curl is reduced to 5 mm or less, and in this state the mask original is guided into the mask original conveying system 21.

Figure 4:
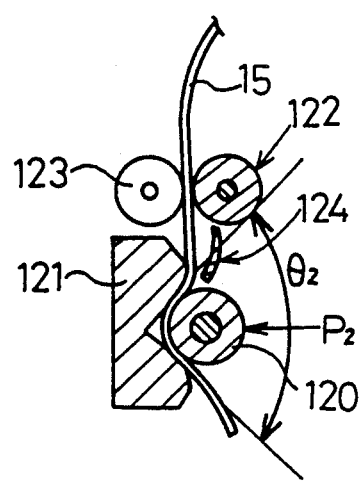
FIG. 4 is a sectional view of a recurler according to a third embodiment of the present invention.

Such a recurler as shown in FIG. 4 is also employable. This recurler is composed of a conveyance roller 122, a free-running roller 123 which is rotated by the rotation of the conveyance roller 122, a rubber roller 120 having a hardness of 70°–90° and a diameter of 10 mm, and guide members 121 and 124 which are superior in slidability. It is optimal that an angle $\theta_2$ of the guide member 121 on the side of the rubber roller 120 be in the range of 90° to 110° and that a force $P_2$ of the rubber roller 120 with respect to the guide member 121 be in the range of 500 g to 1,000 g. As a mask original having an amount of curl of 15 to 20 mm is conducted between the guide member 121 and the guide member 124, the amount of curl is reduced to 5 mm or less, and in this state the mask original is guided into the mask original conveying system 21.

While the invention has been particularly shown and described with reference to preferred embodiments thereof, it will be understood by those skilled in the art that the foregoing and other changes in form and details can be made therein without departing from the spirit and scope of the invention.

What is claimed is:

1. An image forming apparatus for forming an image on a sheet based on at least one original sheet, comprising:
   a preparing means for preparing an original sheet;
   an original feed means for feeding the original sheet along a feed path from the preparing means; and
   a recurl means arranged in the feed path for recurling a curled portion of the original sheet;
   wherein the recurl means comprises a roller and a guide member having a V-shaped groove, and wherein the roller extends into and applies a positive force towards the V-shaped groove.

2. An image forming apparatus according to claim 1, further comprising a guide member arranged upstream of the recurl means, the guide member guiding the curled portion of the original between the V-shaped groove and the roller.

3. An image forming apparatus according to claim 1, wherein an angle of the V-shaped groove is in a range of 90° to 110°.

4. An image forming apparatus for forming an image on a sheet based on at least one original sheet, comprising:
   a positioning device for precisely positioning an original sheet for an exposure operation by a light source, said positioning means comprising an electrostatically charged surface for attracting said original sheet;
   an original sheet feeding means for feeding the original sheet along a feed path to said positioning device; and
   a recurl means arranged in the feed path for recurling a curled portion of the original sheet wherein the recurl means comprises a roller and a guide member having a V-shaped groove, and wherein the roller extends into and applies a positive force towards the V-shaped groove.

5. An imaging forming apparatus according to claim 4, further comprising a guide member arranged upstream of the recurl means, the guide member guiding the curled portion of the original between the V-shaped groove and the roller.

6. An imaging forming apparatus according to claim 4, wherein an angle of the V-shaped groove is in a range of 90° to 110°.

7. An image forming apparatus according to claim 4, further comprising a preparing means for preparing an original sheet, the feeding means feeding the original sheet from the preparing means.

8. An image forming apparatus according to claim 4, wherein the preparing means comprises a thermal fixing means.

9. An image forming apparatus according to claim 4, wherein the preparing means comprises a monochrome laser printer.

* * * * *